United States Patent [19]

Suzuki

[11] Patent Number: 5,377,275
[45] Date of Patent: Dec. 27, 1994

[54] ACTIVE NOISE CONTROL APPARATUS
[75] Inventor: Seiichirou Suzuki, Yokohama, Japan
[73] Assignee: Kabushiki Kaisha Toshiba, Kawasaki, Japan
[21] Appl. No.: 99,005
[22] Filed: Jul. 29, 1993
[30] Foreign Application Priority Data
  Jul. 29, 1992 [JP] Japan .................. 4-202396
[51] Int. Cl.⁵ .................. A61F 11/06; H03B 29/00; F01N 1/06
[52] U.S. Cl. .................. 381/71; 181/206
[58] Field of Search .................. 381/71, 94; 181/206

[56] References Cited
U.S. PATENT DOCUMENTS

| | | | |
|---|---|---|---|
| 4,171,465 | 10/1979 | Swinbanks | 381/71 |
| 4,473,906 | 9/1984 | Warnaka et al. | 381/71 |
| 4,669,122 | 5/1987 | Swinbanks | 381/71 |
| 4,677,676 | 6/1987 | Erickkson | 381/71 |
| 5,119,427 | 6/1992 | Hersh et al. | 381/71 |

FOREIGN PATENT DOCUMENTS 4342813 11/1992 Japan .................. 381/71

OTHER PUBLICATIONS

"The Active Control Of Sound Propagation In Long Ducts" M. A. Swinbanks Journal Of Sound and/Vibration (1973)27(3), pp. 411–436.
"Active Control Of Noise Radiated From Duct End" Masaharu Nishimura and Takanori Arai Japan Acoustical Society Journal (Nihon Onkyogakkai-shi) vol. 45, No. 9 (1989).
"Summary translated to English".

Primary Examiner—Curtis Kuntz
Assistant Examiner—Ping W. Lee
Attorney, Agent, or Firm—Oblon, Spivak, McClelland, Maier, & Neustadt

[57] ABSTRACT

An active noise control apparatus comprises a secondary sound source for generating sound canceling noise emitted from a noise source, first and second microphones sequentially arranged between the noise source and the secondary sound source at a predetermined distance in a direction from the noise source to the secondary sound source, a coefficient multiplier for multiplying an output signal of the second microphone by a coefficient corresponding to a ratio of a transfer function of the first microphone with respect to the secondary sound source to that of the second microphone with respect thereto, a subtracter for obtaining a difference between a multiplication resultant signal and an output signal of the first microphone, and a signal processor for outputting a secondary sound signal obtained by multiplying the difference signal with a predetermined coefficient to the secondary sound source.

14 Claims, 7 Drawing Sheets

ACTIVE NOISE CONTROL APPARATUS

BACKGROUND OF THE INVENTION

1. Field of the Invention

The present invention relates to an active control apparatus, and more particularly to an active control apparatus which can prevent instability such as howling phenomenon, which easily occurs when the active noise control is performed.

2. Description of the Related Art

In order to deal with the noise problem of various types of equipments, an active noise control apparatus to which an acoustic control technique is applied has been recently proposed.

The conventional active noise control apparatus is structured such that sound(noise) emitted from a noise source contained in a duct is prevented from being leaked outside from an opening of the duct. In other words, in this type of the apparatus, noise emitted from the noise source is detected by a microphone, and an output signal of the microphone is introduced to a signal processor with a built-in filter having a predetermined filter coefficient. Then, a secondary sound source, that is, a speaker is operated by the signal obtained by passing through the filter, and noise on the opening of the duct, which is an object to be controlled, is actively canceled by sound emitted from the speaker.

However, the conventional active noise control apparatus has a decisive disadvantage in which instability such as howling phenomenon easily occurs. In other words, sound emitted from the speaker is reflected by the wall of the duct, and detected by the microphone again. More specifically, an electric-acoustic-system feedback circuit is formed in the active noise control apparatus. Accordingly, the apparatus diverges sound depending on the gain, so that sufficient noise reduction effect cannot be obtained.

In order to prevent such a disadvantage, for example, a two-microphone method is proposed in "Active Control of Duct Outlet Emission Sound, by Nishimura, Arai, Shimgaku Giho, vol. 88, No. 105(1988) in Japanese."

According to the above method, sound emitted from the secondary sound source is detected by two microphones, the output signal of one microphone and the output signal output from the other microphone and passed through a delay function circuit with a time delay corresponding to the distance between two microphones, are synthesized by a signal subtracter, and a synthesizing signal is used as a detection signal, so that influence of the secondary sound source signal is removed.

Such a two-microphone method is useful for the long duct structure. However, according to the two-microphone method, sufficient effect to the relative short duct cannot be obtained for the following reason:

More specifically, a sound component $P_M$, which is detected by two microphones, can be expressed as a sum of two components as shown by the following equation:

$$P_M = P_{MS} + P_{MA} \tag{1}$$

wherein $P_{MS}$ is a component sent only from the noise source, and $P_{MA}$ is a component from the secondary sound source. Therefore, in order to satisfy a condition of $P_{MA}=0$, it is necessary to obtain transfer function $G_1$ to be set to one of two microphones.

If it is assumed that a distance, which is from the secondary sound source to the microphone positioned at a portion away from the secondary sound source, is L, a distance between two microphones is $\Delta L$, and a sound wave to be canceled is limited to a frequency range, which is relatively longer than a cross sectional mode of the duct, that is, a range, which can be regarded as a plane wave, the following equation can be established referring to FIG. 2, wherein $P_{PA}$ is progressive wave components from the secondary sound source at a secondary source location, $P_{rA}$ is retreat wave components thereat, k is the wave number shown by $2\pi f/c$, f: frequency of the secondary sound source, and c: acoustic velocity.

$$P_1 = P_{PA} e^{jkL} + P_{rA} e^{-jkL} \tag{2}$$

$$P_2 = P_{PA} e^{jk(L-\Delta L)} + P_{rA} e^{-jk(L-\Delta L)} \tag{3}$$

where $P_1$ is an output signal from the microphone 15a away from the secondary sound source, and $P_2$ an output signal from the microphone 15b near thereto.

$P_{MA}$ is represented as follows:

$$P_{MA} = P_1 - G_1 \cdot P_2 \tag{4}$$

Substituting the equations (2) and (3) for the equation (4), $P_{MA}$ is represented as follows:

$$P_{MA} = e^{jkL}(1 - e^{-jk\Delta L} \cdot G_1) P_{PA} + e^{-jkL}(1 - e^{jk\Delta L} \cdot G_1) P_{rA} \tag{5}$$

It is necessary to obtain $G_1$ in which $P_{MA}$ of the above equation (5) is a howling component and the equation (5) becomes zero.

However, since $P_{PA}$ and $P_{rA}$ cannot be directly identified, it is impossible to obtain $G_1$ in which $P_{MA}=0$. For example, in the case that the long duct is used, energy is absorbed by a wall surface during propagation of the components from the secondary sound source. Due to this, $P_{PA}$ can be set to substantially zero. This case can be expressed by the following equation:

$$G_1 = e^{jk\Delta L} \tag{6}$$

In other words, delay corresponding to the distance between two microphones is given to $G_1$, so that $P_{MA}$ can be set to be substantially zero.

However, in the case that the above two-microphone method is employed for a short duct, sound absorption effect cannot be expected during propagation, so that many reflected sound components of the secondary sound are produced. Accordingly, the sound components from the secondary sound source are not completely eliminated. Therefore, even if the active control noise technique of the two-microphone method is applied to a miniaturized product, howling cannot be prevented.

SUMMARY OF THE INVENTION

An object of the present invention is to provide an active control noise apparatus which can perform a good noise reduction effect even in the structure such as a short duct.

According to the present invention, there is provided an active control noise apparatus wherein sound emitted from a noise source is detected by two microphones, a transfer function from a secondary sound source to each of the two microphones is obtained, a difference signal between first and second output signal, the first output signal being obtained by subjecting the transfer function ratio and an output signal of one microphone to convolution calculation and the second output signal being an output of the other microphone, is obtained, the obtained differential signal is passed through a filter having a predetermined filter coefficient, and a secondary sound source is operated by a signal obtained by passing through the filter, whereby the sound from the noise source can be actively canceled by sound emitted from the secondary sound source at a portion to be noise-controlled.

According to the present invention, a good noise reduction function can be performed by a two-microphone method without generating howling only by a electrical method even in the structure such as a short duct wherein many reflected sound components are produced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENT

An embodiment of the present invention will be explained with reference to the drawings.

Figure 1:
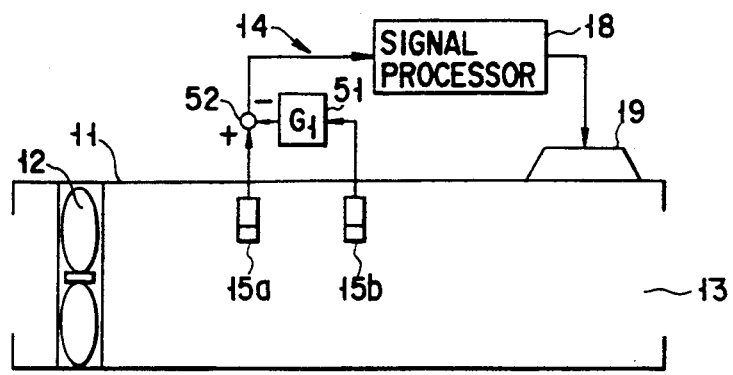
FIG. 1 is a schematic view showing an active noise control apparatus of an embodiment of the present invention.

FIG. 1 shows an embodiment of the present invention in which noise (sound) emitted from a noise source 12 such as an axial-flow fan, which is contained in a duct 11, is prevented from being leaked outside from an opening 13 of the duct 11. An active noise controller 14 comprises microphones 15a and 15b disposed in the duct 11 at a predetermined distance $\Delta L$ in an extending direction thereof, for detecting sound emitted from the noise source 12, a coefficient multiplier 51 having a filter coefficient $G_1$ corresponding to a ratio of the transfer function from a secondary sound source, i.e., speaker 19 to the microphone 15a to that therefrom to the microphone 15b, a signal subtracter 52 for obtaining a difference between the output signal produced from the microphone 15b and passed through the coefficient multiplier 51 and the output signal from the microphone 15a, a signal processor 18 containing a built-in filter having a predetermined filter coefficient, for performing an active noise control for processing an output signal from the signal subtracter 52, and a speaker 19 operated by the signal obtained through the built-in filter of the signal processor 18 and functioning as a secondary sound source.

In other words, the output signal of the microphone 15b, which is positioned at the side of the speaker 19 serving as secondary sound source, is introduced to one input end of the signal subtracter 52, and the output of the microphone 15a is introduced to the other input end of the signal subtracter 52. A difference signal of both outputs obtained by the signal subtracter 52 is introduced to the signal processor 18.

The coefficient multiplier 51 comprises an adaptive control device wherein there is set a coefficient obtained when an adaptive control is stopped after it is executed during a predetermined period as described later. In the coefficient multiplier 51 is set a coefficient of $H = P_1/P_2$, i.e., a ratio of the transfer function of the microphone 15b to that of the microphone 15a, where $P_1$ is the output signal of the microphone 15a, which is obtained when white noise is emitted from the speaker, and $P_2$ that of the microphone 15b.

According to the above-mentioned structure, howling can be reduced regardless of the length of the duct 11, so that the feature of a two-microphone method can be exerted. Moreover, there is an advantage in that no sound absorption process is needed.

The reason will be explained as follows:

The sound component $P_{MA}$ of the secondary sound source 19, which is included in the sound component $P_M$ detected by two microphones 15a and 15b, is expressed by equation (5) as mentioned before. Normally, since sound pressure, which is measured by e.g., a noise level meter is observed as a sum of progressive wave components $P_{PA}$ and retreat wave components $P_{rA}$, it is impossible to identify separately $P_{PA}$ and $P_{rA}$ from the obtained sound pressure.

However, if $G_1$ is developed under a condition that $P_{PA}$ and $P_{rA}$ of equation (5) are known values and equation (5) is 0, the following equation (7) can be obtained:

$$G_1 = \frac{P_{PA}e^{jkL} + P_{rA}e^{-jkL}}{P_{PA}e^{jk(L-\Delta L)} + P_{rA}e^{-jk(L-\Delta L)}} \tag{7}$$

Figure 2:
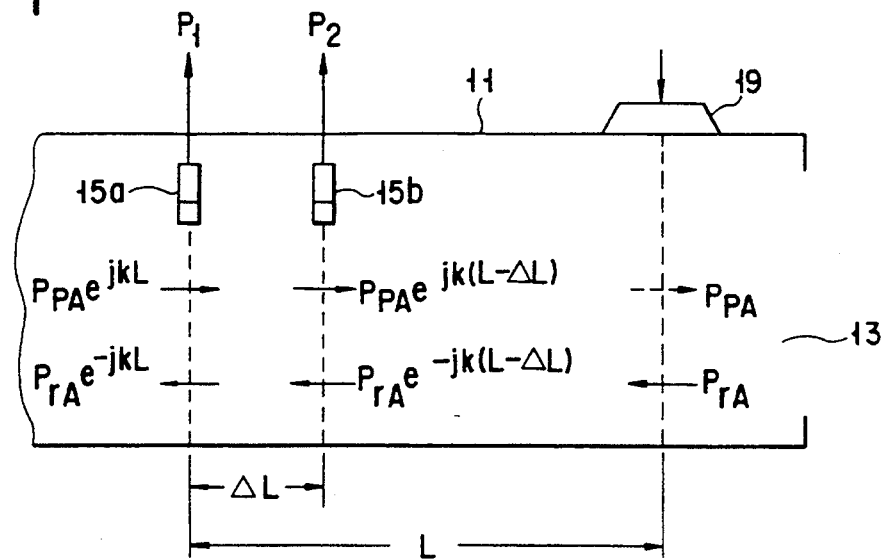
FIG. 2 is a view for explaining a coefficient to be set in a coefficient multiplier incorporated into the apparatus of FIG. 1.

A denominator of equation (7) expresses the transfer function (sound pressure component) $P_2/A$ of the microphone 15b and a numerator expresses the transfer function (sound pressure component) $P_1/A$ of the microphone 15a as shown in FIG. 2. Therefore, the ratio of the transfer function (the following equation (8)), which is obtained when the input signal to the secondary sound source is A, may set to $G_1$ expressed by equation (8):

$$\begin{aligned} G_1 &= (P_1/A)/(P_2/A) \\ &= P_1/P_2 \end{aligned} \tag{8}$$

Figure 3:
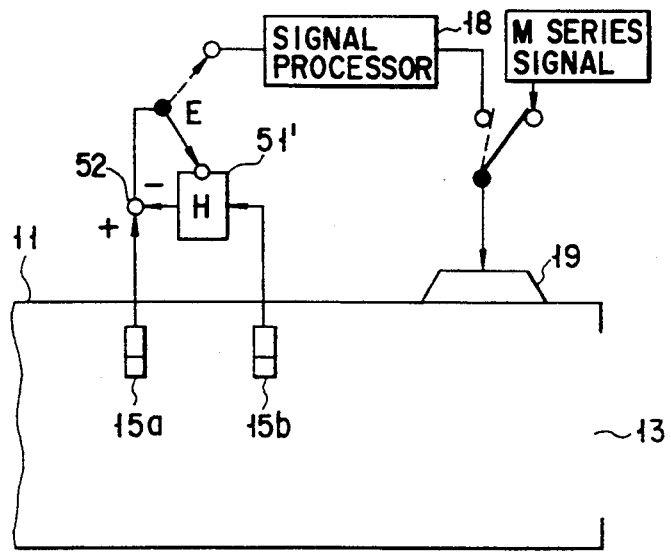
FIG. 3 is a view for explaining an operation for setting the coefficient in the coefficient multiplier incorporated into the apparatus of FIG. 1.

In order to obtain equation (8), an adaptive control device 51' with a built-in digital filter may be used as shown in FIG. 3. As algorithm for such an adaptive control, for example, there is used LMS algorithm, which minimizes a square sum of an error signal E. The output signal $P_2$ of the microphone 15b, which is positioned at the portion close to the speaker 19, is introduced to the adaptive control device 51' as an input signal. Also, the output signal $P_1$ of the microphone 15a, which is positioned at the portion away from the speaker 19, is introduced to the adaptive control device 51' as a reference signal. When the speaker 19 is operated by an M sequential signal and the signals $P_1$ and $P_2$ are introduced to the device 51', the error signal E can be expressed by the following equation (9):

$$E = P_1 - P_2 H \tag{9}$$

In the adaptive control, since E of equation (9) is 0 in an optimum state, the coefficient of the adaptive control device 51' is finally identified as the following equation (10):

$$H = P_1/P_2 \tag{10}$$

Equation (10) is equivalent to equation (8). Therefore, under a condition that the adaptive control device 51' is identified, the component $P_{MA}$ of the secondary sound source, which is detected by two microphones, is 0.

According to this embodiment, at first, a convergence coefficient in the adaptive control device 51' is set to 0. Then, the adaptive control of the adaptive control device 51' is stopped under a condition that E of equation (9) is 0, and the adaptive control device 51', which holds coefficient H identified by equation (10), is used as coefficient multiplier 51, which holds coefficient $G_1$. In other words, for actually performing the noise cancellation operation, the output of the signal subtracter 52, which is used as the error signal E so far, is introduced to the signal processor 18 as an adaptive control signal.

More specifically, the coefficient H is calculated in the adaptive control device 51' by convolution calculation. When the coefficient H is obtained, the output terminal of the subtracter 52 is switched from the adaptive control device 51' to the signal processor 18, whereby the output signal of the subtracter 52 is supplied thereto.

Therefore, it is possible to use only the component from the noise source 12 as a signal to be introduced to the signal processor 18, and noise of the opening 13 of the duct 11 can be effectively canceled by the two-microphone method without generating howling. The switching operation of the output of the signal subtracter 52, which is from the adaptive control device 51' to the signal processor 18, may be performed in a hardware using a switch element or in a software.

Figure 4:
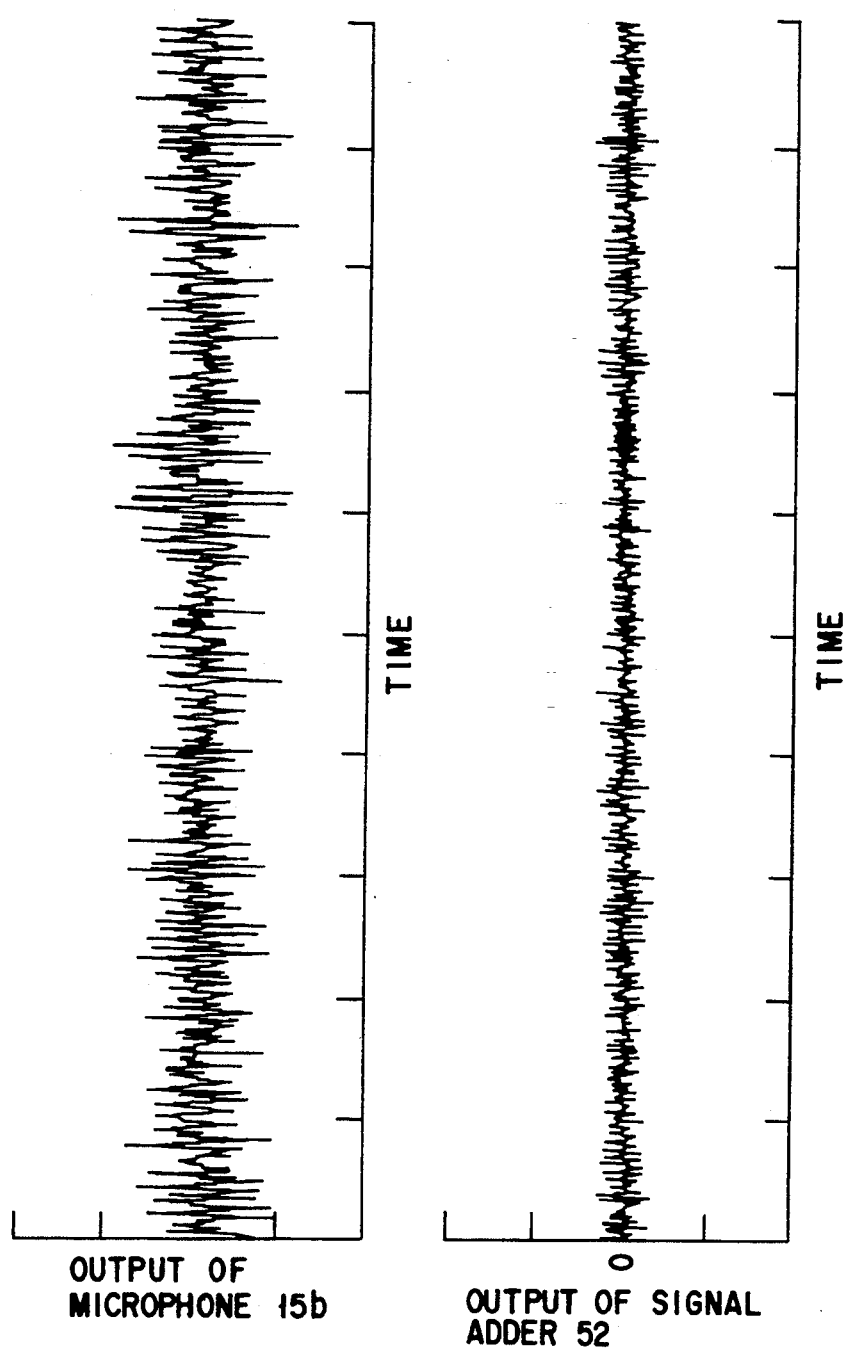
FIGS. 4A and 4B are views respectively showing an output signal of one microphone and a synthesizing output signal of two microphones in the present invention, both obtained when a secondary sound source is operated by the apparatus of FIG. 1.
Figure 5:
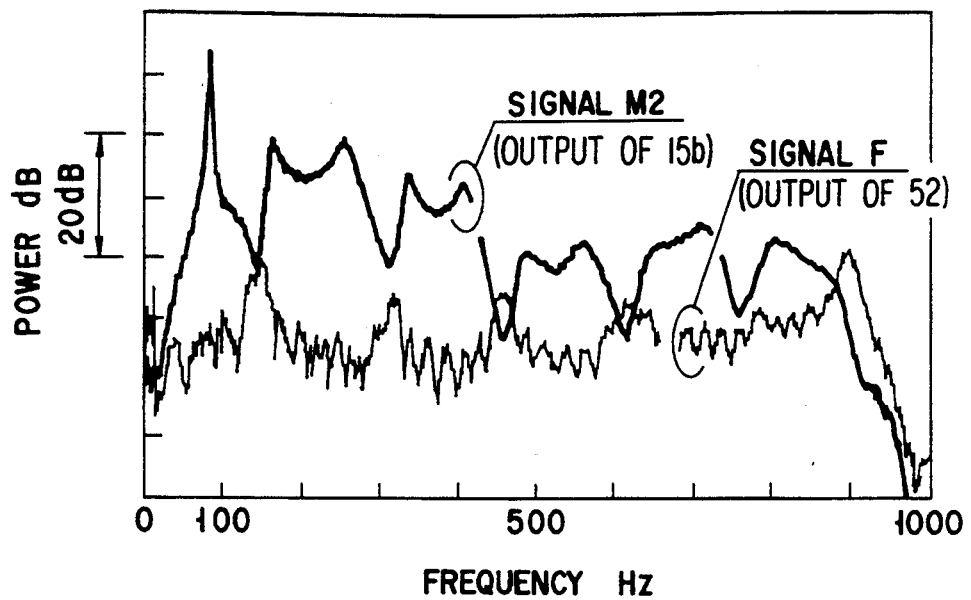
FIG. 5 shows the output signals shown in FIGS. 4A and 4B in a form of power spectrum.

FIGS. 4A and 4B respectively show the output signals of the microphone 15b and the subtracter 52, which are along a time axis, when the sound emitted only from the secondary sound source 19 is detected by the microphones 15a and 15b under a condition that coefficient H of the adaptive control device 51' is set to the relationship shown by equation (10). As is obvious from these figures, the output signal of the signal subtracter 52 can be sufficiently decreased. In other words, howling components can be sufficiently reduced. This condition is shown in FIG. 5 as power spectrum corresponding to the output signals shown in FIGS. 4A and 4B. In this case, since the adaptive control device 51' can be directly used as coefficient multiplier 51, there is an advantage in that the system can be simplified. Moreover, the structure of the active noise control apparatus based on the two-microphone method is equivalent to the structure of the active noise control device in which the high pass filter process is subjected to a sound source signal as understood from the two-microphone output characteristic shown in FIG. 15. Therefore, in an extremely low frequency region in which the emission efficiency of the speaker is worse, the sensibility of the active noise control apparatus can be lowered. This effectively works when the active noise control apparatus is structured in accordance with the adaptive control method. In other words, since the emission characteristic of the speaker is worse in such an extremely low frequency region, the adaptive control device should not identify the sound component of the above frequency region as possible. However, the certain extent level of the sound component in the above frequency region is actually fed to the adaptive control device. In order to remove such a level of the component, a high pass filter is most useful. However, if such a high pass filter is used for an adaptive control, it may cause the length of the to-be-controlled duct to be longer. However, if the active noise control using two microphones is employed, an acoustic high pass filter can be formed, so that an electric circuit is not needed. Further, since the control area can be adjusted by the space between two microphones, it is unnecessary to consider the length of the duct.

Figure 13:
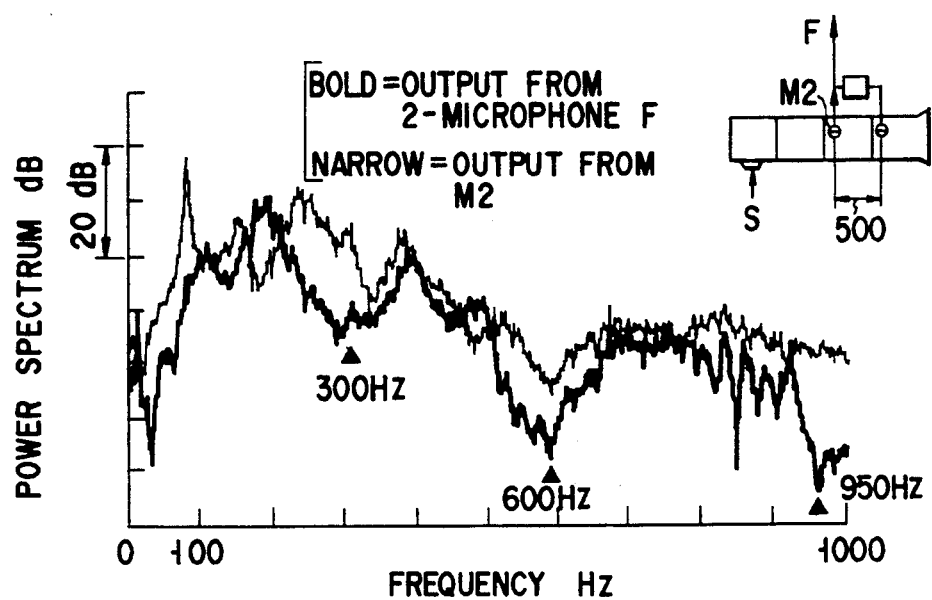
FIG. 13 is a view showing the output characteristics of two microphones in a form of power spectrum.
Figure 14:
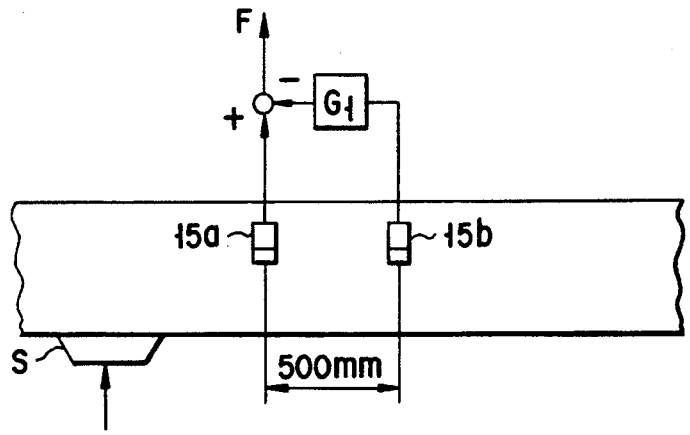
FIG. 14 is a schematic view of an experimental noise control apparatus for obtaining the characteristic shown in FIG. 13.

FIG. 13 shows an experimental result when a speaker S in FIG. 14 is driven. The bold-line output characteristic shown in FIG. 13 represents an output signal F obtained when two microphones 15a and 15b are arranged at an interval of 500 mm as shown in FIG. 14, and the narrow-line indicates an output characteristic of the microphone 15a.

Figure 15:
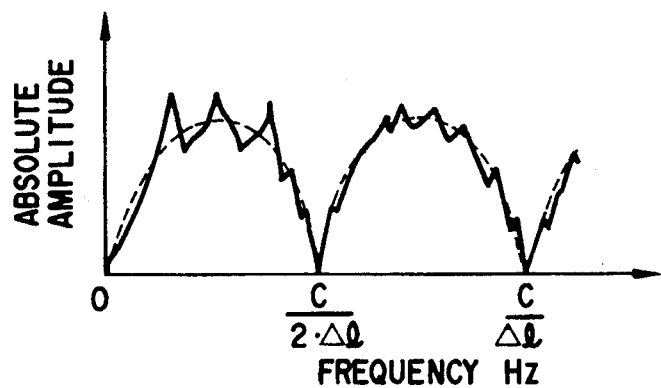
FIG. 15 is a view showing the output characteristic according to the two-microphone method of the present invention.

The bold-line output characteristic shown in FIG. 13 is similar to the characteristic shown in FIG. 15 corresponding to a model case of two-microphone method. In other words, the experimental result coincides approximately with theory. More specifically, in FIG. 13, the bold-line output characteristic corresponding to the output signal F based on the two-microphone method of the present invention in a frequency range from 0 Hz to 100 Hz represents a power level lower than in the narrow-line output characteristic corresponding to the output signal of the microphone 15a. This two-microphone output characteristic is similar to the output characteristic of the high-pass filter.

Since the distance between two microphones 15a and 15b is 500 mm as shown in FIG. 14, the frequency $f_{ins}$ in which the sensitivity of the microphones is lost is represented by the following equation:

$$f_{ins} = \frac{C}{2 \cdot \Delta l} n = \frac{330}{2 \times 0.5} n$$
$$= 330n \text{ Hz } (n = 0, 1, 2, \ldots)$$

This value substantially equals to the experimental result.

FIGS. 6 to 9 explain the difference between the conventional noise cancellation apparatus using a single microphone and the present noise cancellation system using two microphones in the effect of howling prevention. In these figures, the narrow-line characteristic shows a characteristic of the power spectrum obtained from the noise source before an active noise control, and the bold-line characteristic shows a characteristic obtained after the active noise control.

Figure 6:
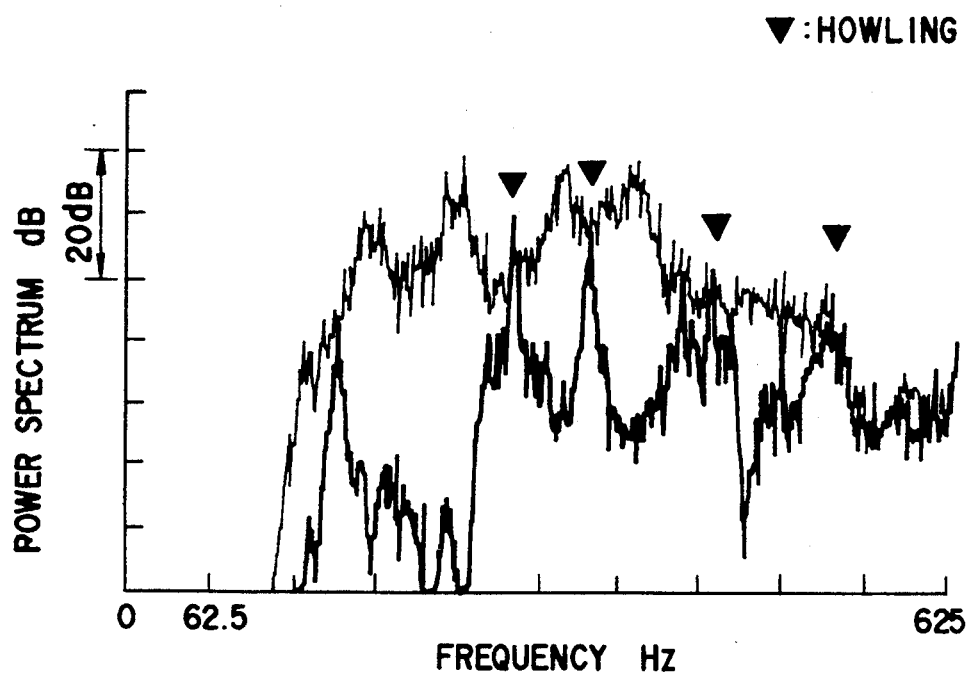
FIG. 6 is a view showing a noise cancellation characteristic of a conventional noise cancellation system using white noise.
Figure 7:
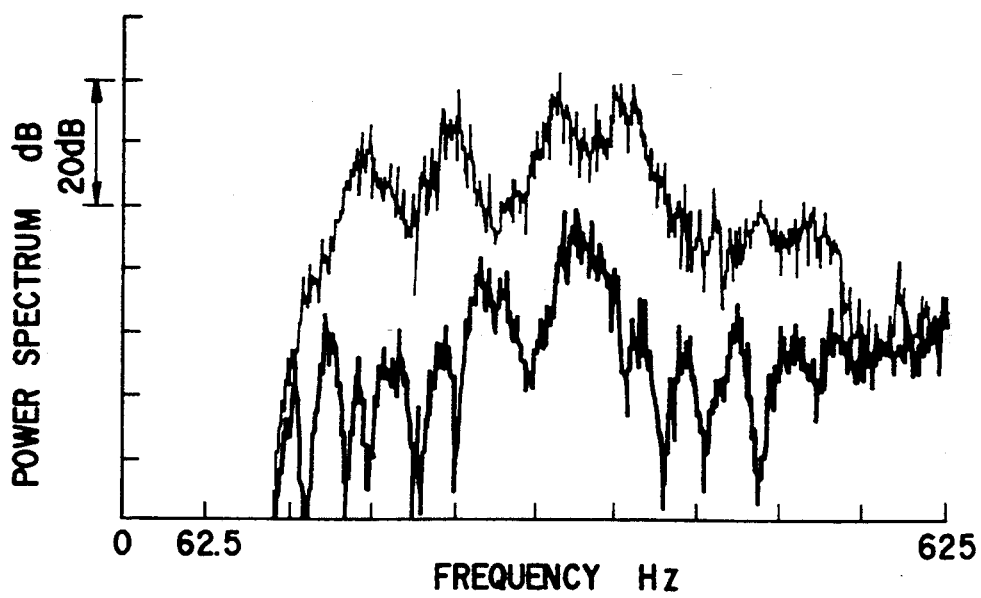
FIG. 7 is a view showing a noise cancellation characteristic of the noise cancellation system using the present invention wherein white noise is used.

FIGS. 6 and 7 show the characteristic when white noise is used as a noise source. In the characteristic of the conventional noise cancellation system as shown in FIG. 6, it can be seen that a instability signal due to howling is generated by the secondary sound source as shown in marks ▼. On the other hand, in the characteristic of the noise cancellation system employing the present invention, howling is not generated as shown in FIG. 7.

Figure 8:
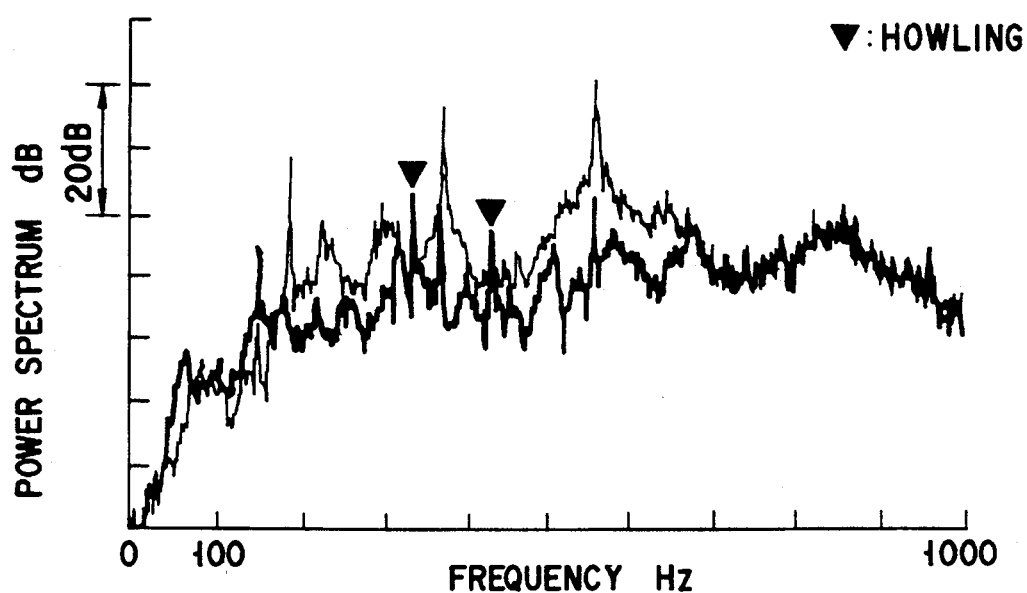
FIG. 8 is a view showing a noise cancellation characteristic of the conventional noise cancellation system using fan sound as noise.
Figure 9:
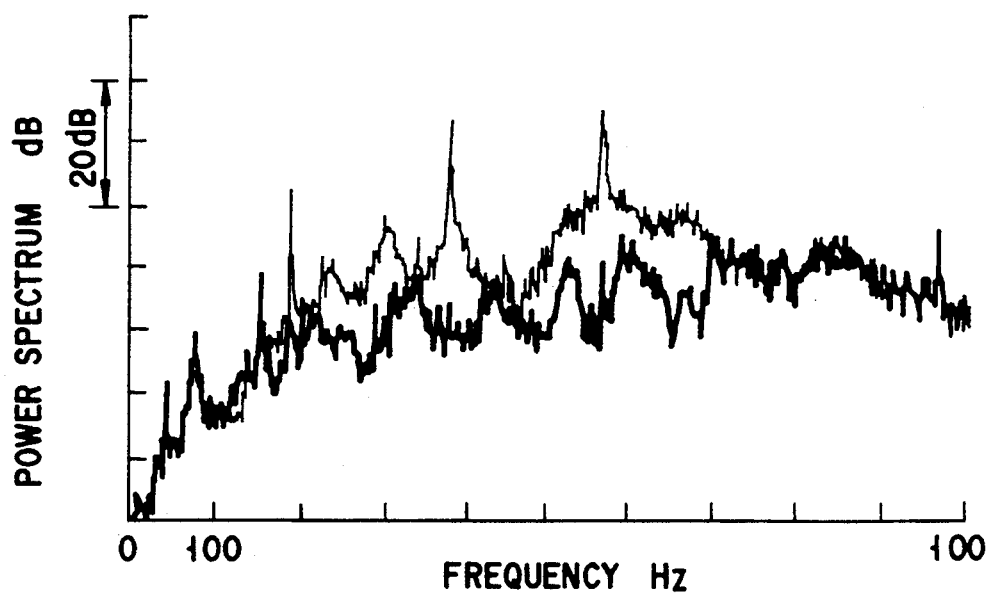
FIG. 9 is a view showing a noise control cancellation characteristic of the noise cancellation system using the present invention wherein fan sound is used as noise.

FIGS. 8 and 9 show the characteristic when an axial-flow fan is used as a noise source. As is obvious from these characteristic views, in the characteristic of the conventional noise cancellation system, howling is generated at the portions shown by marks ▼. On the other hand, in the characteristic of the noise cancellation system employing the present invention, howling is substantially completely controlled.

Figure 10:
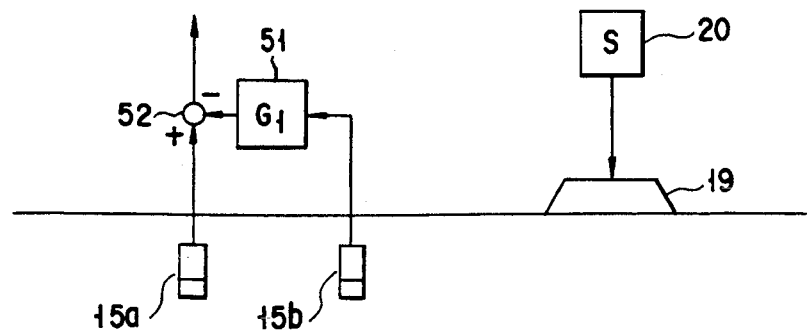
FIG. 10 is a schematic view of an active noise control apparatus of the other embodiment according to the present invention which obtains a coefficient by use of an FFT analyzer.

FIG. 10 explains an embodiment in which a coefficient is set by use of an FFT (Fast Fourier Transform) analyzer.

According to this embodiment, a white noise generator 20 is connected to the second sound source 19 (or A). By use of the FFT analyzer, transfer function $G_{AM1}$, which is from the white noise generator 20 to the microphone 15a ($M_1$), and transfer function $M_{A2}$, which is from the white noise generator 20 to the microphone 15b ($M_2$), are measured. A coefficient $G_1$ in the frequency region can be obtained in the coefficient multiplier 51 by the following equation:

$$G_1 = G_{AM1}/G_{MA2}$$

As a result of the calculation, the coefficient $G_1$ is transferred to an impulse response function by an inverse Fourier transfer. The impulse response function is set to the control device 51' as a filter coefficient H. Thereafter, the output signal of the subtracter 52 is fed to and processed by the signal processor 18, the output signal of which is fed to the speaker 19 as a secondary sound signal. Thereby, noise in the opening 13 is actively canceled by the secondary sound sent from the speaker 19.

Figure 11:
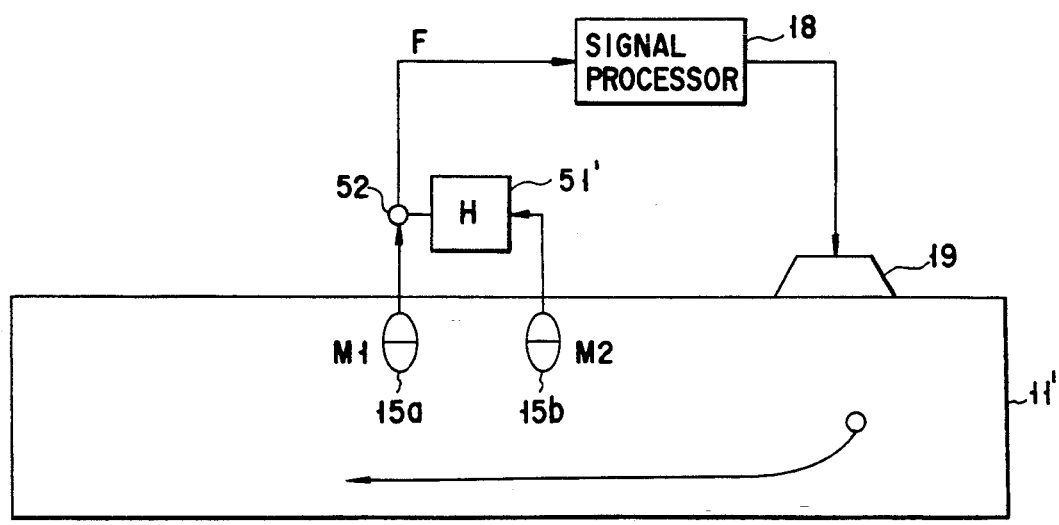
FIG. 11 is a schematic view of an experimental noise cancellation system using the embodiment of FIG. 10.

FIG. 11 shows an experimental noise cancellation system in which coefficient $G_1$ determined in FIG. 10 is transferred to an impulse response function and sent to the control device 51' as a filter coefficient H and a close duct 11" is used, and which has a structure similar to that of the apparatus shown in FIG. 1. In the experimental noise cancellation system shown in FIGS. 1 and 11, a power spectrum of the output signal $M_2$ of the microphone 15b, which is obtained when the white noise is outputted from the secondary sound source, i.e., speaker 19, and a power spectrum of the control sound cancellation output due to the two-microphone method, i.e., the power spectrum of the output signal F of the subtracter 52 is shown in FIG. 5. It is understood by FIG. 5 that the howling components based on white noise sent from the secondary sound source 19 is suppressed.

Figure 12:
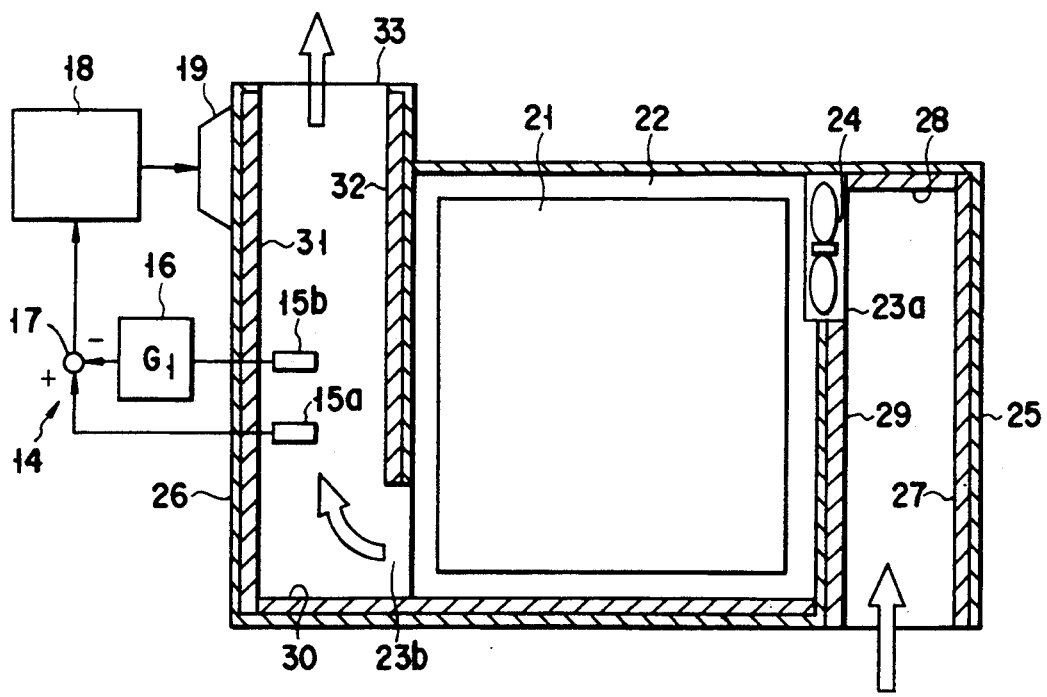
FIG. 12 is a schematic view showing a computer in which the noise cancellation system using the present invention is provided.

FIG. 12 shows an example in which an computer is applied to the present invention. In this figure, a substrate 21 on which an IC chip, for example, is mounted is arranged in a room 22. Drafts 23a and 23b are respectively formed on the wall existing at the diagonal position of the room 22, and a fan 24 is provided at the draft 23a.

The fan 24 is used by the so-called push system. Therefore, the draft 23a is located at a suction side, and the draft 23b is located at a discharge side. The draft 23a, which structures the suction side, is communicated with a suction duct 25, which is extended to be transferred at an angle of 90° to the central axis of the draft 23a. Also, the draft 23b, which structures the discharge side, is communicated with a discharge duct 26, which is extended to be transferred at an angle of 90° to the central axis of the draft 23b. Acoustic materials 27, 28, 29, 30, 31, and 32 having high absorption effect are attached to the inner surface of the suction duct 25 and that of the discharge duct 26.

The high-frequency noise components are sufficiently suppressed by the acoustic materials, and the low frequency noise components are suppressed by the active noise controller 14.

In the above example, in order to prevent noise of the fan 24 and the flow sound from being leaked from an opening 33 of the discharge duct 25, the active noise controller 14, which is structured as the same manner as the example shown by FIG. 1, is provided.

By the above-mentioned structure, noise, which tends to leak from an outlet port of a cooling passage, can be effectively canceled by the two-microphone method without howling.

In the structure shown in FIG. 12, an active noise controller is provided only on the flow outlet side, but it may be provided on the flow inlet side. Also, two active noise controllers may be provided on the flow inlet side and outlet side, respectively.

If the active noise controllers are provided on the flow inlet and outlet sides, noises, which tends to leak from the inlet and outlet ports of the cooling passage, can be effectively cancelled by the two-microphone method without howling.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An active noise control apparatus for controlling primary sound emitted from a noise source, comprising:
   a secondary sound source for generating secondary sound cancelling the primary sound sent from said noise source;
   first and second microphones arranged between said noise source and said secondary sound source at a predetermined distance in a direction from said noise source to said secondary sound source, said first microphone being nearer to said secondary sound source than said second microphone; and
   signal processing means for multiplying an output signal of said second microphone by a coefficient corresponding to a ratio of a first transfer function to a second transfer function, said first transfer function being a transfer function from said secondly sound source to said first microphone and said second transfer function being a transfer function from said secondary sound source to said second microphone, for obtaining a difference between a multiplication resultant signal and an output signal of said first microphone, and for generating a secondary sound signal obtained by subjecting a predetermined process to a signal corresponding to the difference to feed the secondary sound signal to said secondary sound source.

2. The apparatus according to claim 1, wherein said signal processing means comprises:
   coefficient means for setting the ratio of the first transfer function to the second transfer function as the coefficient therein, and multiplying the coefficient with the output signal from said second microphone to produce a first resultant signal;
   synthesizing means for producing a difference signal indicating a difference between the resultant signal of said coefficient means and the output signal of said first microphone; and
   adaptive control means for supplying a signal obtained by multiplying the difference signal of said synthesizing means with a predetermined coefficient to said secondary sound source.

3. The apparatus according to claim 2, wherein said adaptive control means includes means for receiving the output signal from said second microphone near to said secondary sound source as an input signal and the output signal from said first microphone which is further away from the secondary sound source than the second microphone as a reference signal, multiplying the output signal of the second microphone with the coefficient from the coefficient means to obtain a resultant signal, comparing the resultant signal with the reference signal to obtain a comparison resultant value, and updating the coefficient from the coefficient means so that the comparison resultant value is decreased, and the coefficient from the coefficient means identified by said adaptive control means is held in said coefficient means.

4. The apparatus according to claim 2, wherein said coefficient means stores a coefficient $G_1$ determined by a following equation:

$$G_1 = \frac{P_{PA}e^{jkL} + P_{rA}e^{-jkL}}{P_{PA}e^{jk(L-\Delta L)} + P_{rA}e^{-jk(L-\Delta L)}}$$

where $P_{PA}$ is progressive wave components from the secondary sound source at a secondary source location, $P_{rA}$ is retreat wave components at a secondary source location, L is a distance from the secondary sound source to the first microphone positioned at a portion away from the secondary sound source, $\Delta L$ is a distance between the first and second microphones, k is a wave number shown by $2\pi f/c$, f: frequency of the sound source, and c: acoustic velocity.

5. The apparatus according to claim 2, wherein said secondary sound source comprises a speaker to which the secondary sound signal is supplied.

6. An active noise control apparatus for actively controlling primary sound emitted from a noise source arranged in a duct, comprising:
   a secondary sound source mounted on said duct, for emitting secondary sound, which cancels the primary sound sent from said noise source to said duct;
   first and second microphones disposed in said duct and arranged between said noise source and said secondary sound source at a predetermined distance in a direction from said noise source to said secondary sound source, for outputting first and second output signals, respectively, said first microphone being nearer to said secondary sound source than said second microphone;
   adaptive control means connected to said first and second microphone and including means for calculating a coefficient corresponding to a ratio of a first transfer function to a second transfer function by way of convolution calculation, said first transfer function being a transfer function from said secondary sound source to said first microphone and said second transfer function being a transfer function from said secondary sound source to said second microphone, means for multiplying the output signal of said second microphone by the coefficient to output a multiplication resultant signal, and means for obtaining a difference between the multiplication resultant signal and the output signal of said first microphone to output a difference signal; and
   signal processor means for processing the difference signal and outputting a secondary sound signal obtained by multiplying the difference signal with a predetermined coefficient to said secondary sound source.

7. The apparatus according to claim 6, wherein said adaptive control means includes means for receiving the output signal from said second microphone near to said secondary sound source as an input signal and the output signal from said first microphone which is further away from the secondary sound source than the second microphone as a reference signal, multiplying the output signal of the second microphone with the coefficient corresponding to said ratio to obtain a resultant signal, means for comparing the resultant signal with the reference signal to obtain a comparison resultant value, and means for updating the coefficient corresponding to said ratio so that the comparison resultant value is decreased, and the coefficient corresponding to said ratio identified by said adaptive control means is held in said coefficient means.

8. The apparatus according to claim 6, wherein said means for calculating a coefficient includes a calculator for calculating a coefficient $G_1$ determined by a following equation:

$$G_1 = \frac{P_{PA}e^{jkL} + P_{rA}e^{-jkL}}{P_{PA}e^{jk(L-\Delta L)} + P_{rA}e^{-jk(L-\Delta L)}}$$

where $P_{PA}$ is progressive wave components from the secondary sound source, $P_{rA}$ is retreat wave components, L is a distance from the secondary sound source to the first microphone positioned at a portion away from the secondary sound source, $\Delta L$ is a distance between the first and second microphones, k is the number of waves shown by $2\pi f/c$, f: frequency of the secondary sound source, and c: acoustic velocity.

9. The apparatus according to claim 6, wherein said secondary sound source comprises a speaker to which the secondary sound signal is supplied.

10. An active noise control apparatus for controlling primary sound emitted from a noise source, comprising:
a secondary sound source for generating secondary sound cancelling the primary sound sent from said noise source;
first and second microphones at a predetermined distance, said first microphone being nearer to said secondary sound source than said second microphone; and
signal processing means for multiplying an output signal of said second microphone by a coefficient corresponding to a ratio of a first transfer function to a second transfer function, said first transfer function representing progressive and retreat components of reflection waves of the secondary sound source detected by the first microphone, said second transfer function representing progressive and retreat components of reflection waves of the secondary sound source detected by the second microphone, for obtaining a difference between a multiplication resultant signal and an output signal of said first microphone, and for generating a secondary sound signal obtained by subjecting a predetermined process to a signal corresponding to the difference to feed the secondary sound signal to said secondary sound source.

11. The apparatus according to claim 10, wherein said signal processing means comprises:
coefficient means for setting the ratio of the first transfer function to the second transfer function as the coefficient therein, and multiplying the coefficient with the output signal from said second microphone to produce a first resultant signal;
synthesizing means for producing a difference signal indicating a difference between the resultant signal of said coefficient means and the output signal of said first microphone; and
adaptive control means for supplying a signal obtained by multiplying the difference signal of said synthesizing means with a predetermined coefficient to said secondary sound source.

12. The apparatus according to claim 11, wherein said adaptive control means includes means for receiving the output signal from said second microphone near to said secondary sound source as an input signal and the output signal from said first microphone which is further away from the secondary sound source than the second microphone as a reference signal, multiplying the output signal of the second microphone with the coefficient from the coefficient means to obtain a resultant signal, comparing the resultant signal with the reference signal to obtain a comparison resultant value, and updating the coefficient from the coefficient means so that the comparison resultant value is decreased, and the coefficient from the coefficient means identified by said adaptive control means is held in said coefficient means.

13. The apparatus according to claim 11, wherein said coefficient means stores a coefficient $G_1$ determined by a following equation:

$$G_1 = \frac{P_{PA}e^{jkL} + P_{rA}e^{-jkL}}{P_{PA}e^{jk(L-\Delta L)} + P_{rA}e^{-jk(L-\Delta L)}}$$

where $P_{PA}$ represents progressive wave components from the secondary source at a secondary source location, $P_{rA}$ represents retreat wave components at a secondary source location, L is a distance from the secondary sound source to the first microphone positioned at a portion away from the secondary sound source, $\Delta L$ is a distance between the first and second microphones, k is a wave number shown by $2\pi f/c$, f: frequency of the sound source, and c: acoustic velocity.

14. The apparatus according to claim 11, wherein said secondary sound source comprises a speaker to which the secondary sound signal is supplied.

* * * * *